(12) United States Patent
Lin et al.

(10) Patent No.: US 9,543,486 B1
(45) Date of Patent: Jan. 10, 2017

(54) LED PACKAGE WITH REFLECTING CUP

(71) Applicant: ADVANCED OPTOELECTRONIC TECHNOLOGY, INC., Hsinchu Hsien (TW)

(72) Inventors: Hou-Te Lin, Hsinchu (TW); Pin-Chuan Chen, Hsinchu (TW); Lung-Hsin Chen, Hsinchu (TW); Wen-Liang Tseng, Hsinchu (TW)

(73) Assignee: ADVANCED OPTOELECTRONIC TECHNOLOGY, INC., Hsinchu Hsien (TW)

( * ) Notice: Subject to any disclaimer, the term of this patent is extended or adjusted under 35 U.S.C. 154(b) by 0 days.

(21) Appl. No.: 14/946,110

(22) Filed: Nov. 19, 2015

(30) Foreign Application Priority Data

Oct. 19, 2015 (CN) .......................... 2015 1 0675967

(51) Int. Cl.
| *H01L 33/60* | (2010.01) |
| *H01L 33/50* | (2010.01) |
| *H01L 33/48* | (2010.01) |
| *H01L 33/54* | (2010.01) |
| *H01L 33/56* | (2010.01) |

(52) U.S. Cl.
CPC ............. *H01L 33/60* (2013.01); *H01L 33/486* (2013.01); *H01L 33/50* (2013.01); *H01L 33/507* (2013.01); *H01L 33/54* (2013.01); *H01L 33/56* (2013.01)

(58) Field of Classification Search
CPC .................................. H01L 33/50; H01L 33/60
See application file for complete search history.

(56) References Cited

U.S. PATENT DOCUMENTS

| 8,896,199 | B2 * | 11/2014 | Ito | H01L 33/505 313/502 |
| 2010/0264438 | A1 * | 10/2010 | Suenaga | H01L 33/58 257/98 |
| 2013/0056781 | A1 * | 3/2013 | Suenaga | H01L 33/58 257/98 |
| 2013/0313602 | A1 * | 11/2013 | Suenaga | H01L 33/58 257/98 |
| 2014/0001504 | A1 * | 1/2014 | Lin | H01L 24/97 257/98 |
| 2014/0070238 | A1 * | 3/2014 | Kim | H01L 33/483 257/88 |
| 2014/0159076 | A1 * | 6/2014 | Sota | H01L 33/60 257/88 |

(Continued)

FOREIGN PATENT DOCUMENTS

| CN | 102227011 A | * 10/2011 |
| CN | 103165793 A | * 6/2013 |
| JP | 2015-26871 A | 2/2015 |

*Primary Examiner* — Victor A Mandala
*Assistant Examiner* — Regan J Rundio
(74) *Attorney, Agent, or Firm* — Zhigang Ma

(57) ABSTRACT

The present disclosure provides a light emitting diode package which includes a plurality of electrodes, an LED die, a reflecting cup, a reflecting layer, and a phosphor layer. The LED die are electrically connected with the electrodes. The reflecting cup is formed on the electrodes and surrounds the LED die. The reflecting cup includes an inner surface. The reflecting layer is formed between the inner surface and LED die, and the reflecting layer has a higher pyrogenation temperature than the reflecting cup. The phosphor layer covers the LED die.

17 Claims, 4 Drawing Sheets

(56) References Cited

U.S. PATENT DOCUMENTS

| | | | | |
|---|---|---|---|---|
| 2014/0175482 A1* | 6/2014 | Jang | ................ | H01L 33/60 257/98 |
| 2014/0175483 A1* | 6/2014 | Lin | ................ | H01L 33/486 257/98 |
| 2015/0188004 A1* | 7/2015 | Ozeki | ................ | H01L 33/507 257/98 |
| 2015/0204494 A1* | 7/2015 | Wada | ................ | H01L 25/0753 313/498 |
| 2015/0262987 A1* | 9/2015 | Wada | ................ | H01L 33/46 257/98 |
| 2015/0263239 A1* | 9/2015 | Watanabe | ................ | F21V 13/14 362/293 |
| 2016/0093779 A1* | 3/2016 | Maeno | ................ | H01L 33/60 257/98 |
| 2016/0093780 A1* | 3/2016 | Beppu | ................ | H01L 33/60 257/98 |

* cited by examiner

LED PACKAGE WITH REFLECTING CUP

CROSS-REFERENCE TO RELATED APPLICATIONS

This application claims priority to Chinese patent application no. 201510675967.4 filed on Oct. 19, 2015, the contents of which are incorporated by reference herein.

FIELD

The subject matter generally relates to light emitting diode (LED) package and particularly relates to an LED package having a reflecting cup.

BACKGROUND

Illumination devices can be based on one or more different light sources. For example, light sources can include incandescent light bulbs, compact fluorescent lamps and fluorescent tubes. Recent developments have made use of light emitting diodes. In some implantations, the illumination device can include a reflective cup in conduction with an LED package.

BRIEF DESCRIPTION OF THE DRAWINGS

Implementations of the present technology will now be described, by way of example only, with reference to the attached figures.

DETAILED DESCRIPTION

Figure 1:
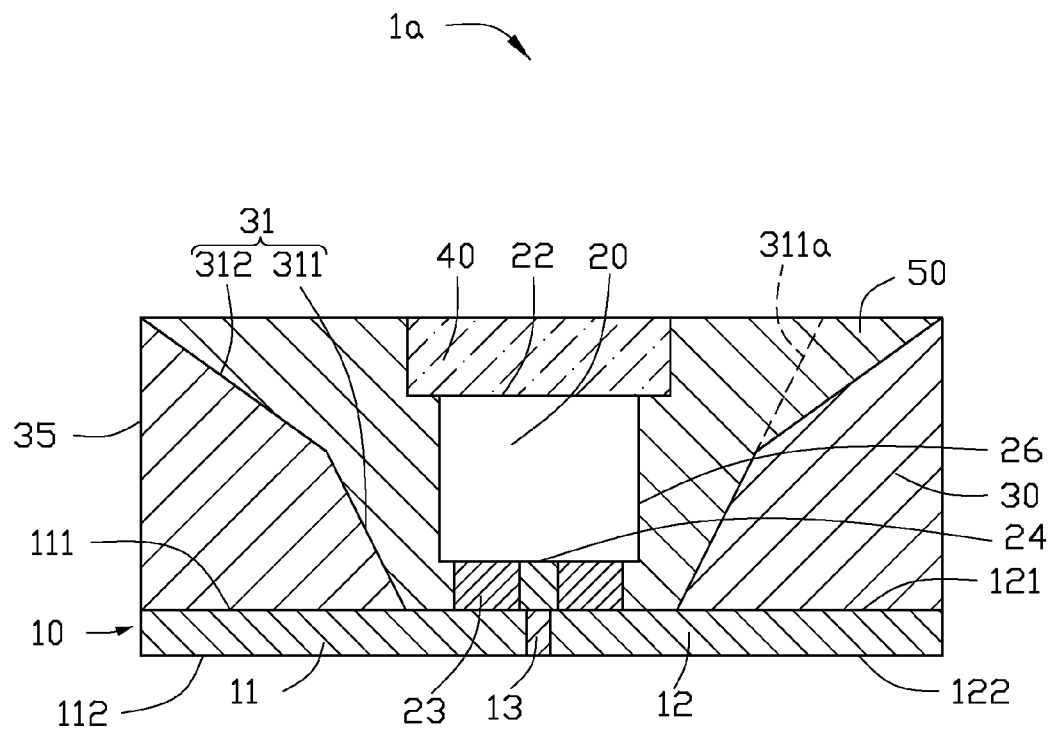
FIG. 1 is a diagrammatic, cross-sectional view of an LED package in accordance with a first exemplary embodiment of the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

A definition that applies throughout this disclosure will now be presented.

The term "comprising," when utilized, means "including, but not necessarily limited to"; it specifically indicates open-ended inclusion or membership in the so-described combination, group, series and the like.

The present disclosure is described in relation to an LED having a reflecting cup.

FIG. 1 illustrates an LED package 1a in accordance with a first embodiment of the present disclosure. The LED package 1a includes a plurality of electrodes 10, an LED die 20 electrically connected with the electrodes 10, a reflecting cup 30 formed on the electrodes 10 and surrounding the LED die 20, a phosphor layer 40 covering and sealing the LED die 20, and a reflecting layer 50 formed between the LED die 20 and the reflecting cup 30.

The plurality of electrodes 10 include a first electrode 11 and a second electrode 12 spaced from the first electrode 11. The first electrode 11 includes a first top surface 111 and a first bottom surface 112 opposite to the first top surface 111. The second electrode 12 includes a second top surface 121 and a second bottom surface 122. The first top surface 111 and the second top surface 121 are configured for carrying and electrically connecting the LED die 20. The first bottom surface 112 and the second bottom surface 122 are exposed out of the LED package 1a and electrically connected to a circuit (not shown) for supplying power for the LED package 1a.

The first electrode 11 and the second electrode 12 are made of metal having excellent electric capability, such as copper or aluminum. An insulating layer 13 is formed between the first electrode 11 and the second electrode 12. The insulating layer 13 is made of a material which does not conduct electricity. In the illustrated embodiment, the first top surface 111 and the second top surface 121 are coplanar. The first bottom surface 112 and the second bottom surface 122 are also coplanar. The LED die 20 is electrically connected to the electrodes 10.

In one example, such as the illustrated one, the first electrode 11 and the second electrode 12 act as a substrate to carry the LED die 20, whereby an additional substrate for carrying the LED die 20 can be omitted.

The LED die 20 can be mounted on the electrodes 10 via wire bonding or flip chip bonding and so on. In the illustrated embodiment, the LED die 20 is mounted on the first electrode 11 and the second electrode 12 via two pads 23 to omit a wire connecting the LED die 20 to the electrodes 10, thereby reducing a size of the LED package 1. The LED die 20 includes a top light emitting surface 22, a lower surface 24 and a plurality of lateral surfaces 26 connecting the top light emitting surface 22 and the lower surface 24. The lower surface 24 is attached on the first electrode 11, the insulating layer 13 and the second electrode 12. In the embodiment, a number of the lateral surfaces 26 is four.

The reflecting cup 30 is formed on the first electrode 11 and the second electrode 12. The reflecting cup 30 surrounds the LED die 20 and the electrodes 10. The reflecting cup 30 includes an inner surface 31 and an outer surface 35. The inner surface 31 is spaced apart from the lateral sides 26 of the LED die 20. The inner surface 31 extends from the electrodes 10 along a direction of light emitted from the LED die 20 away from the LED die 20. The outer surface 35 is substantially perpendicular to the electrodes 10. The outer surface 35 is coplanar to sidewalls of the electrodes 10.

The inner surface 31 includes a first face 311 and a second face 312. The first face 311 is located at a bottom portion of the reflecting cup 30. The second face 312 is located at top portion of the reflecting cup 30. The first face 311 is connected with the second face 312. The first face 311 defines an imaginary face 311a along an extension direction of the first face 311 towards top portion of the reflecting cup 30. The second face 312 is located at an outer side of the imaginary face 311a and surrounds the imaginary face 311a.

The second face 312 extends to the outer surface 35 of the reflecting cup 30 to form a top surface of the reflecting cup 30.

In the illustrated embodiment, the first face 311 and the second face 312 are both inclined surfaces. Preferably, an angle between the first face 311 and the second face 312 is between 90 degrees and 180 degrees. A slope of the first face 311 is less than that of the second face 312. An angle between the first face 311 and the electrodes 10 is larger than an angle between the second face 312 and the electrodes 10. The second face 312 is located between the imaginary face 311a and the outer surface 35 of the reflecting cup 30. The second face 312 provides more place between the reflecting cup 30 and the LED die 20 to receive the reflecting layer 50.

The phosphor layer 40 covers the LED die 20. In the illustrated embodiment, the phosphor layer 40 is directly stacked on the top light emitting surface 22. An area of the phosphor layer 40 is larger than that of the LED die 20, thus, the phosphor layer 40 can entirely cover the LED die 20. Light emitted from the LED die 20 strikes on the phosphor layer 40 and obtain a mixed light.

The inner surface 31 of the reflecting cup 30 is spaced apart away from the phosphor layer 40 and the LED die 20 to define a cavity therebetween. The reflecting layer 50 is filled in the cavity. In other words, the reflecting layer 50 is formed between the inner surface 31 of the reflecting cup 30 and the LED die 20.

A pyrogenation temperature of the reflecting layer 50 is higher than that of the reflecting cup 30. In the illustrated embodiment, the reflecting cup 30 is made of epoxy resin. The reflecting layer 50 is made of silicon resin. Both of the reflecting cup 30 and the reflecting layer 50 are non-transparent. The reflecting layer 50 having higher pyrogenation temperature and being heat-resisting is located at a closest place to the LED die 20, even the LED die 20 generates a lot of heat, the reflecting layer 50 can also remain the property thereof. The LED package 1 is protected from yellowing and destroying because the material close to the LED die is heat-resisting.

Figure 2:
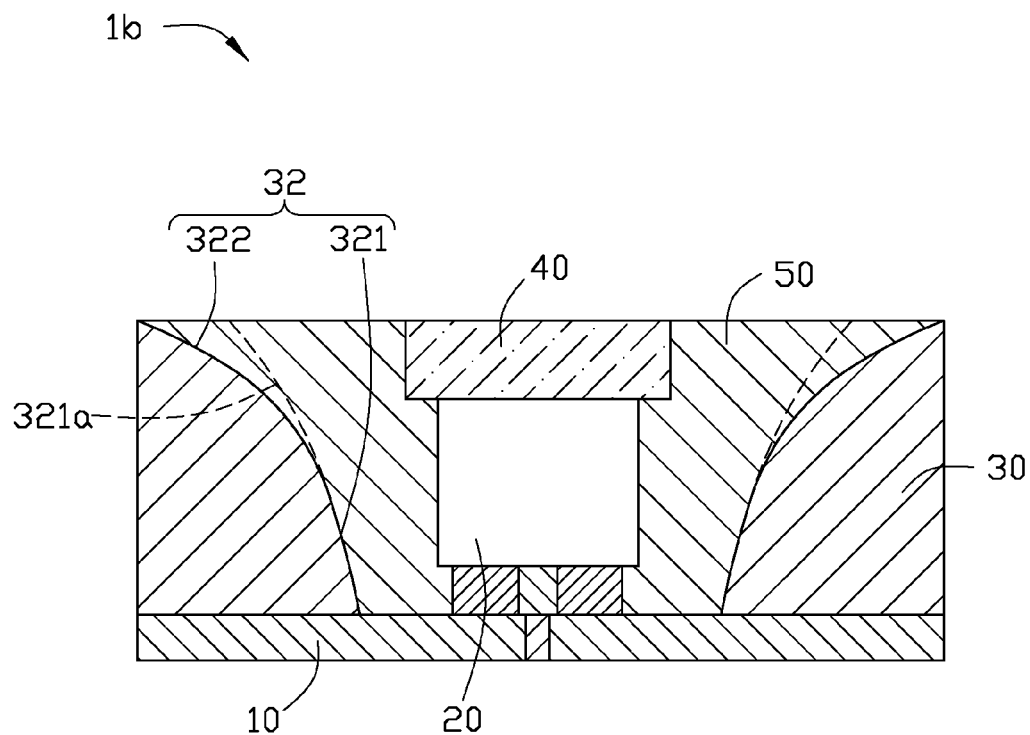
FIG. 2 is a diagrammatic, cross-sectional view of an LED package in accordance with a second exemplary embodiment of the present disclosure.

FIG. 2 illustrates a LED package 1b in accordance with a second embodiment of the present disclosure. The LED package 1b also includes electrodes 10, an LED die 20 electrically connected with the electrodes 10, a reflecting cup 30 formed on the electrodes 10 and surrounding the LED die 20, a phosphor layer 40 covering the LED die 20, and a reflecting layer 50 filled between the LED die 20 and the reflecting cup 30.

The present disclosure also describes a difference between the LED package 1b of the second embodiment and the LED package 1a of the first embodiment. The inner surface 32 of the reflecting cup 30 includes a first face 321 and a second face 322. The first face 321 and the second face 322 are both curved surfaces. Both of the first face 321 and the second face 322 are convex faces protruding towards the LED die 20. A curvature of the first face 321 is less than that of the second face 322. The first face 321 defines an imaginary face 321a along an extension direction and the curvature of the first face 321 towards top portion of the reflecting cup 30. The second face 322 is located at outer side of the imaginary face 321a and surrounds the imaginary face 321a. The second face 322 is located between the imaginary face 321a and the outer surface 35 of the reflecting cup 30. The second face 322 provides more place between the reflecting cup 30 and the LED die 20 to receive the reflecting layer 50. In this illustrated embodiment, the reflecting layer 50 covers both the first face 321 and the second face 322. The top surface of the reflecting layer 50 is coplanar to the phosphor layer 40.

Figure 3:
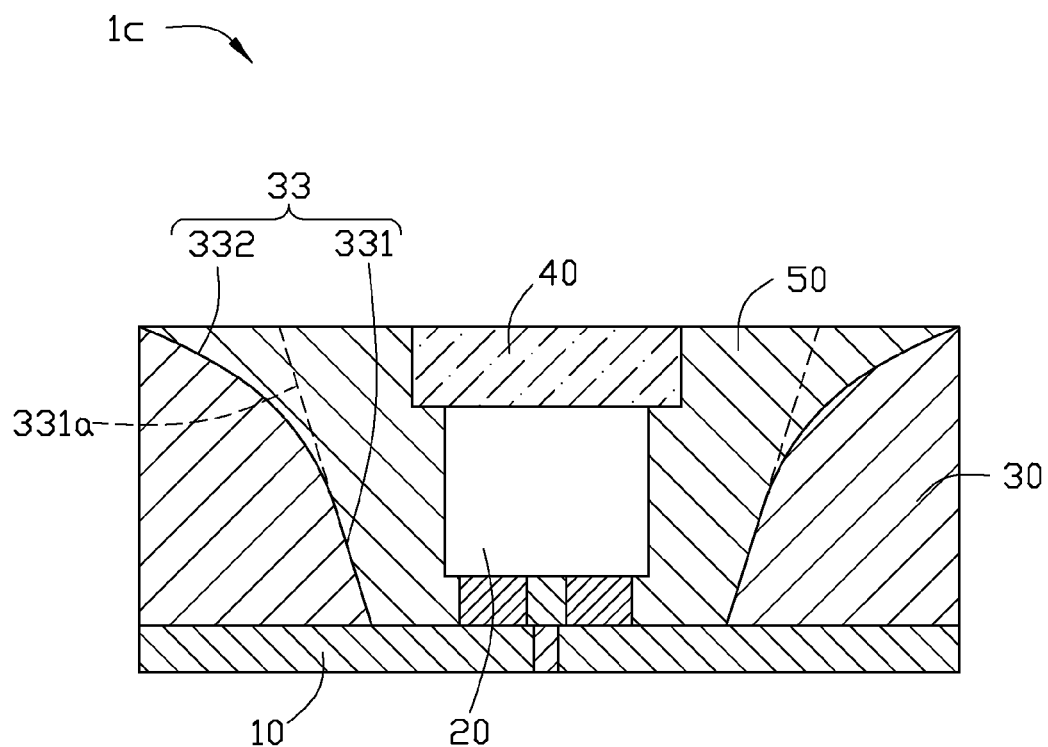
FIG. 3 is a diagrammatic, cross-sectional view of an LED package in accordance with a third exemplary embodiment of the present disclosure.

FIG. 3 illustrates a LED package 1c in accordance with a third embodiment of the present disclosure. The LED package 1c also includes electrodes 10, an LED die 20 electrically connected with the electrodes 10, a reflecting cup 30 formed on the electrodes 10 and surrounding the LED die 20, a phosphor layer 40 covering the LED die 20, and a reflecting layer 50 filled between the LED die 20 and the reflecting cup 30.

The present disclosure also describes a difference between the LED package 1c of the third embodiment and the LED package 1a of the first embodiment. The inner surface 33 of the reflecting cup 30 includes a first face 331 and a second face 332. The first face 331 is an inclined face and the second face 332 is a curved surface. The second face 332 is a convex face protruding towards the LED die 20. The first face 331 defines an imaginary face 331a along an extension direction and the slope of the first face 331 towards top portion of the reflecting cup 30. The second face 332 is located at outer side of the imaginary face 331a and surrounds the imaginary face 331a. The second face 332 is located between the imaginary face 331a and the outer surface 35 of the reflecting cup 30. The second face 332 provides more place between the reflecting cup 30 and the LED die 20 to receive the reflecting layer 50. In this illustrated embodiment, the reflecting layer 50 covers both the first face 331 and the second face 332. The top surface of the reflecting layer 50 is coplanar to the phosphor layer 40.

Figure 4:
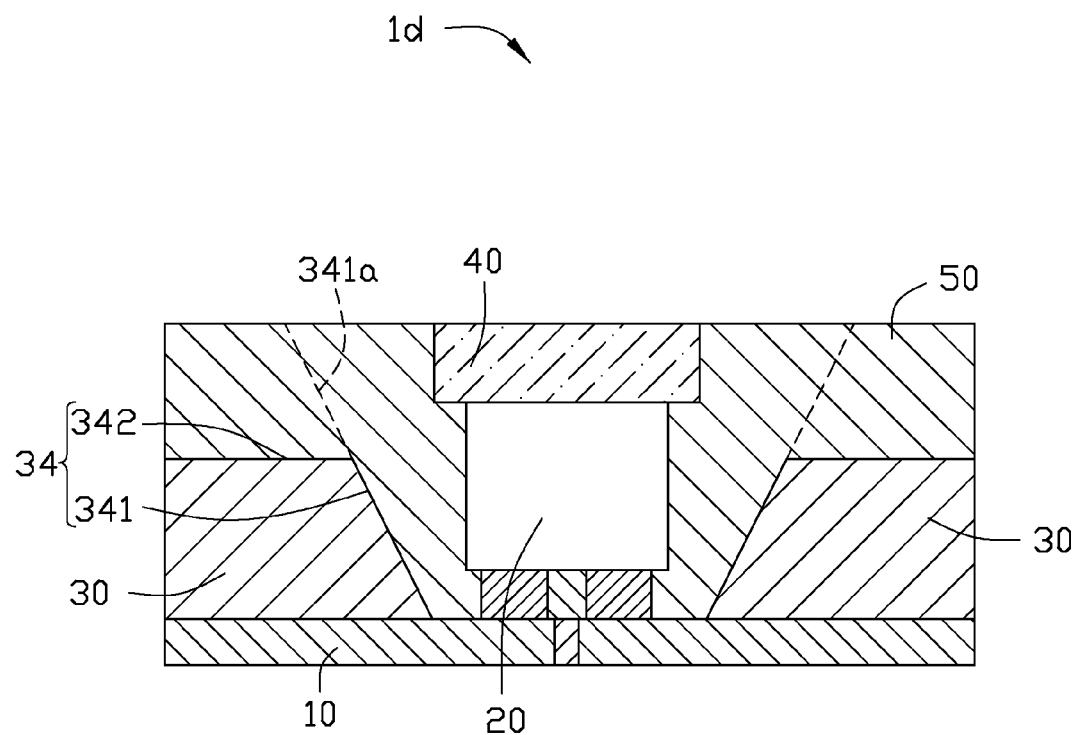
FIG. 4 is a diagrammatic, cross-sectional view of an LED package in accordance with a fourth exemplary embodiment of the present disclosure.

FIG. 4 illustrates a LED package 1d in accordance with a fourth embodiment of the present disclosure. The LED package 1d also includes electrodes 10, an LED die 20 electrically connected with the electrodes 10, a reflecting cup 30 formed on the electrodes 10 and surrounding the LED die 20, a phosphor layer 40 covering the LED die 20, and a reflecting layer 50 filled between the LED die 20 and the reflecting cup 30.

The present disclosure also describes a difference between the LED package 1d of the third embodiment and the LED package 1a of the first embodiment. The inner surface 34 of the reflecting cup 30 includes a first face 341 and a second face 342. The first face 341 is an inclined face and the second face 342 is a horizontal surface. The second face 342 is parallel to the electrodes 10. The first face 341 defines an imaginary face 341a along an extension direction and the slope of the first face 341 towards top portion of the reflecting cup 30. The second face 342 is located at outer side of the imaginary face 341a and surrounds the imaginary face 341a. The second face 342 is located between the imaginary face 341a and the outer surface 35 of the reflecting cup 30. The second face 342 provides more place between the reflecting cup 30 and the LED die 20 to receive the reflecting layer 50. In the illustrated embodiment, the reflecting layer 50 covers both of the first face 341 and the second face 342. The top surface of the reflecting layer 50 is coplanar to the phosphor layer 40.

In the LED package 1a/1b/1c/1d in the present disclosure can avoid yellowing, and reduce a volume of the LED package. The side surfaces of the LED die 20 is not sheltered from the inner surface 31/32/33/34 of the reflecting cup 30, light emitted from the LED die 20 can emit out not only from the top light emitting surface 22 but also from the lateral sides 26 of the light emitting diode 20, thereby increasing luminous efficiency.

It is to be further understood that even though numerous characteristics and advantages have been set forth in the foregoing description of embodiments, together with details of the structures and functions of the embodiments, the disclosure is illustrative only; and that changes may be made in detail, according in matters of shape, size, and arrangement of parts within the principles of the disclosure to the full extent indicated by the broad general meaning of the terms in which the appended claims are expressed.

The embodiments shown and described above are only examples. Many details are often found in the art such as the other features of an LED package. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, especially in matters of shape, size and arrangement of the parts within the principles of the present disclosure up to, and including the full extent established by the broad general meaning of the terms used in the claims. It will therefore be appreciated that the embodiments described above may be modified within the scope of the claims.

What is claimed is:

1. A light emitting diode (LED) package comprising:
   a plurality of electrodes;
   an LED die electrically connected with the plurality of electrodes;
   a reflecting cup formed on the electrodes and surrounding the LED die, the reflecting cup comprising an inner surface, wherein the inner surface extends from the electrodes along a direction of light emitted from the LED die away from the LED die, the inner surface comprises a first face and a second face, the first face is located at a bottom portion of the reflecting cup, and the second face is located at a top portion of the reflecting cup, the first face is an inclined face and the second face is a curved surface, and the second face is a convex face protruding towards the LED die;
   a reflecting layer formed between the inner surface and the LED die, the reflecting layer having a higher pyrogenation temperature than the reflecting cup; and
   a phosphor layer covering the LED die.

2. The LED package of claim 1, wherein the reflecting cup is made of epoxy resin, and the reflecting layer is made of silicon resin.

3. The LED package of claim 1, wherein the first face defines an imaginary face along an extension direction of the first face towards the top portion of the reflecting cup, and the second face is located at an outer side of the imaginary face and surrounds the imaginary face.

4. The LED package of claim 3, wherein the second face extends to an outer surface of the reflecting cup to form a top surface of the reflecting cup.

5. The LED package of claim 3, wherein the reflecting layer covers both of the first face and the second face, and a top surface of the reflecting layer is coplanar to the phosphor layer.

6. A light emitting diode (LED) package comprising:
   a plurality of electrodes;
   an LED die electrically connected with the plurality of electrodes and comprising a top light emitting surface and a plurality of lateral sides extending downward from the top light emitting surface;
   a reflecting cup formed on the electrodes and surrounding the LED die, the reflecting cup comprising an inner surface, the inner surface comprising a first face and a second face, the first face and the second face being connected below the top light emitting surface of the LED die, wherein the first face is located at a bottom portion of the reflecting cup, and the second face is located at a top portion of the reflecting cup, the first face is an inclined face and the second face is a curved surface, and the second face is a convex face protruding towards the LED die;
   a reflecting layer formed between the inner surface and lateral sides of the LED die, the reflecting layer having a higher pyrogenation temperature than the reflecting cup; and
   a phosphor layer covering the LED die.

7. The LED package of claim 6, wherein the inner surface extends from the electrodes along a direction of light emitted from the LED die away from the LED die.

8. The LED package of claim 6, wherein the first face defines an imaginary face along an extension direction of the first face towards the top portion of the reflecting cup, and the second face is located at an outer side of the imaginary face and surrounds the imaginary face.

9. The LED package of claim 6, wherein the reflecting cup is made of epoxy resin, and the reflecting layer is made of silicon resin.

10. The LED package of claim 6, wherein the second face extends to an outer surface of the reflecting cup to form a top surface of the reflecting cup.

11. The LED package of claim 6, wherein the reflecting layer covers both of the first face and the second face, and a top surface of the reflecting layer is coplanar to the phosphor layer.

12. A light emitting diode (LED) package comprising:
    a plurality of electrodes;
    an LED die electrically connected with the plurality of electrodes and comprising a top light emitting surface and a plurality of lateral sides extending downward from the top light emitting surface;
    a reflecting cup formed on the electrodes and surrounding the LED die, the reflecting cup comprising an inner surface, the inner surface comprising a first face and a second face, the first face and the second face being connected below the top light emitting surface of the LED die, wherein the first face is located at a bottom portion of the reflecting cup, and the second face is located at a top portion of the reflecting cup, the first face is an inclined face and the second face is a horizontal surface, the second face is parallel to the electrodes;
    a reflecting layer formed between the inner surface and lateral sides of the LED die, the reflecting layer having a higher pyrogenation temperature than the reflecting cup; and
    a phosphor layer covering the LED die.

13. The LED package of claim 12, wherein the inner surface extends from the electrodes along a direction of light emitted from the LED die away from the LED die.

14. The LED package of claim 12, wherein the first face defines an imaginary face along an extension direction of the first face towards the top portion of the reflecting cup, and the second face is located at an outer side of the imaginary face and surrounds the imaginary face.

15. The LED package of claim 12, wherein the reflecting cup is made of epoxy resin, and the reflecting layer is made of silicon resin.

16. The LED package of claim 12, wherein the second face extends to an outer surface of the reflecting cup to form a top surface of the reflecting cup.

17. The LED package of claim 12, wherein the reflecting layer covers both of the first face and the second face, and a top surface of the reflecting layer is coplanar to the phosphor layer.

* * * * *